United States Patent [19]

Green et al.

[11] Patent Number: 4,468,639

[45] Date of Patent: Aug. 28, 1984

[54] MONOLITHIC COMBINED CHARGE TRANSFER AND SURFACE ACOUSTIC WAVE DEVICE

[75] Inventors: Jonathan B. Green, Palo Alto; Gordon S. Kino, Stanford, both of Calif.

[73] Assignee: The United States of America as represented by the Secretary of the Navy, Washington, D.C.

[21] Appl. No.: 426,405

[22] Filed: Sep. 29, 1982

[51] Int. Cl.$^3$ .......................... H03H 9/64; H03H 9/30; H03H 15/02

[52] U.S. Cl. .......................................... 333/153; 332/2; 332/52; 333/195; 333/196; 357/26; 364/821

[58] Field of Search ................................ 333/150-155, 333/193-196, 165, 166; 330/5.5; 357/26; 364/821; 310/313 R, 313 A, 313 B, 313 C, 313 D; 332/2, 52

[56] References Cited

U.S. PATENT DOCUMENTS

| | | | |
|---|---|---|---|
| 3,851,280 | 11/1974 | Staples | 333/150 |
| 3,970,778 | 7/1976 | Adkins | 178/7.1 |
| 3,982,113 | 9/1976 | Coldren | 333/150 |
| 4,019,200 | 4/1977 | Adkins et al. | 357/26 |
| 4,041,419 | 8/1977 | Desormiere et al. | 333/30 R |
| 4,065,736 | 12/1977 | London | 333/150 X |
| 4,066,984 | 1/1978 | Stern et al. | 333/30 R |
| 4,124,828 | 11/1978 | Bert | 333/195 X |
| 4,128,615 | 12/1978 | Tournois et al. | 310/313 |
| 4,129,798 | 12/1978 | Defranould | 310/313 |
| 4,134,623 | 1/1979 | Tournois et al. | 310/313 |
| 4,194,171 | 3/1980 | Jelks | 333/149 |
| 4,207,546 | 6/1980 | Grudkowski | 333/152 |
| 4,322,696 | 3/1982 | Sakaue et al. | 333/166 |

OTHER PUBLICATIONS

Hagon et al., "Monolithic Programmable Tapped Delay Line (PTDL) Technology for Spread Spectrum Systems", Naecon '74 Record 1974; pp. 244-251.

Lambert, "Programmable Surface Acoustic Wave Devices Utilizing Hybrid Microelectronic Techniques", Proceedings of the Conference on Hybrid Microelectronics, Canterbury, Kent, England, (Sep. 25-27, 1973), pp. 161-171.

*Primary Examiner*—Marvin L. Nussbaum
*Attorney, Agent, or Firm*—R. F. Beers; C. D. B. Curry; G. L. Craig

[57] ABSTRACT

A novel technique for fabrication of a new class of surface acoustic wave (SAW) signal processing devices. Substrates of non-piezoelectric silicon or weakly piezoelectric gallium arsenide are prepared and a thin film of a piezoelectric material, such as zinc oxide, is deposited on the substrate. Interdigital transducers are fabricated at each end of the device to inject/receive SAW signals. A row of P-N diodes is constructed in the substrate underneath the SAW beam path and a metal electrode is deposited on top of the zinc oxide film. The diodes may be serially addressed/controlled by a variety of devices external to the SAW beam path, but fabricated on the same substrate and the new device used to provide transformation between high-frequency signals and low-frequency signals having the same time-bandwidth product.

8 Claims, 2 Drawing Figures

MONOLITHIC COMBINED CHARGE TRANSFER AND SURFACE ACOUSTIC WAVE DEVICE

BACKGROUND OF THE INVENTION

1. Field of the Invention

The present invention relates to signal processing using surface acoustic waves (SAW). More particularly, the invention relates to monolithic SAW storage correlator having separately addressable FET taps and having capability to process high frequency signals where the processing is controlled by low frequency analog digital signals.

2. Description of the Prior Art

Modern, high speed signal processing systems are increasing the incorporation of acoustic components. Surface acoustic wave (SAW) devices offer the advantages of high reliability, low power consumption, small size, simple construction and the ability to process high-speed signals in real time as an alternative to much larger, more complex electronic systems.

Several types of SAW devices for correlation/convolution of high-speed electrical signals are used in the prior art but all such conventional devices have limitations overcome by the present invention.

One type of prior art SAW device utilizes an air-gap technology. A piezoelectric substrate is spaced near a semiconductor material across a very thin gap. Metal electrodes attached to the piezoelectric material generate surface waves which can interact with the charge carriers in the semiconductor material via the local electric fields carried by the surface waves in the piezoelectric material. The major disadvantage of such air-gap SAW devices is the difficult and expensive fabrication of the air-gaps to the tolerances required. The present invention uses a thin piezoelectric film sputtered onto a non-piezoelectric semiconductor substrate and therefore does not require an air gap. The present invention is consequently much simpler and less expensive to fabricate than those devices employing the air-gap technology. The monolithic construction of the present invention permits taking advantage of the SAW induced interaction between the piezoelectric film and the semiconductor substrate. Additionally, monolithic SAW devices can be made in which the necessary switches, modulators, etc. required for use with SAW filters can be constructed on the same substrate.

Some prior art SAW devices have been constructed with field effect transistors incorporated into the semiconductor substrate after which peizoelectric transducers are mounted on top of the substrate or, alternatively, metallic transducers overlaid with a piezoelectric film are used. However, the devices currently available provide no means for storage of an rf modulated waveform. The present invention is a monolithic programmable device combining the high speed signal processing characteristics of SAW deices in relatively simple interconnection with a very flexible, low frequency input-output system. This enables storage of a high frequency analog waveform which may subsequently be read out of the device at low-speed, thereby accomplishing the features of a fast-in, slow out buffer memory. In one alternative embodiment, the invention acts as a high-speed, programmable filter. The filter acts on high frequency signals, yet the filter characteristics may be altered (or programmed) at low speeds.

SUMMARY OF THE INVENTION

A new type of surface acoustic wave (SAW) signal processing device is described. Substrates of non-piezoelectric silicon or weakly piezoelectric gallium arsenide are prepared with charge-carrying arrays fabricated in the substrate. A piezoelectric material in which electric fields may be generated in response to applied high-frequency bulk or surface acoustic waves is deposited on the substrate. The electrical fields in the piezoelectric material interact in a known way with the charge carriers in the semiconductor to store a known charge pattern in the charge carriers, diodes for example. Each charge carrier, or diode, in the array is then connected to a common external terminal by a series of FET switches which are in turn connected to some programmable low-frequency multiplexing circuitry such as a shift register, charge-coupled device (CCD), random access memory (RAM) or the like. The charge carriers, FET switches and low frequency multiplexing circuitry are all integrated into the same substrate as that upon which the piezoelectric material is deposited.

A primary object of invention is to provide an apparatus and method for controlling high speed, high-frequency signal processing by low-speed, low-frequency means.

A further object of the invention is to provide a device, herein referred to as a SAW/FET, in which each charge storage site within the storage correlator is connected to a common external terminal by a series of FET switches which are programmably controlled by a low-frequency multiplexer such as a shift register.

Yet another object of invention is to provide an aparatus and method for analog or digital signal processing in real time at high frequencies (UHF range).

A further object of the invention is to provide a device that can store high speed analog waveforms for subsequent readout into a slow speed signal processing system (a computer for example).

DESCRIPTION OF THE PREFERRED EMBODIMENT

Figure 1:
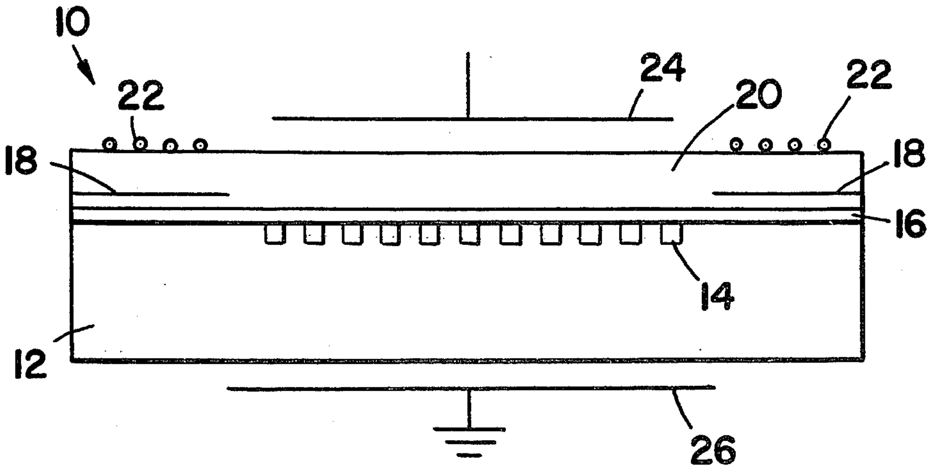
FIG. 1 is a schematic of a high-speed SAW storage correlator.

A SAW storage correlator is a signal processing device in which it is possible to store an analog signal and then correlate it with a later analog signal. Additionally, correlation between two coded signals having time-bandwidth factor of 5000 or more, such as those used in spread-spectrum systems, can be obtained in real time. The basic storage correlator 10, shown in FIG. 1, has a semiconductor substrate 12, silicon or gallium arsenide for example, in the central region of which an integrated circuit array is fabricated underneath the acoustic beampath. By way of example and not limitation, the array of the present invention is a linear array of 2 P-N diodes 14 per acoustic wavelength. Then an insulating oxide layer 16, usually $SiO_2$, is grown over the array after which conducting pads 18, Au for example, are deposited followed by deposition of a film of a piezoelectric material, ZnO for example, 20 serving to generate electric fields in response to injected acoustic energy. The conducting pads 18 serve as the ground planes for the interdigital transducers 22 used to inject the acoustic energy. A top plate electrode 24 and a ground plane electrode 26 are then deposited on the monolithic SAW correlator as shown in the central region between the transducers 22. For clarity, the plates 24 are shown slightly separated from the SAW/-FET structure. There is no actual gap.

In operation, if a short pulse of voltage V is applied to the top plate 24 any individual diode 14 becomes charged to a potential close to V. After the pulse is turned off the capacity remains charged such that the correlator may clearly act as a storage device. If a surface acoustic wave signal is passing under the plate 24 at the same time the array of diodes 14 is turned on the signal stored in each diode 14 consists of the sum of the surface acoustic wave signal and the applied pulse. Thus a spatially varying charge pattern corresponding to the surface acoustic wave signal is stored over the array of diodes 14. At a later time, a second voltage pulse or reading pulse may be applied to the top plate 24. This generates a spatially varying voltage drop across the piezoelectric material which depends on the charge stored in each diode 14. This in turn excites surface acoustic waves in the piezoelectric film 18 which can be received on either interdigital transducer 22. If a more general form of reading signal is applied the correlation of this signal with the original signal read into the device is obtained as an output from one of the transducers 22 and the convolution of the two signals is obtained from the other transducer 22.

Figure 2:
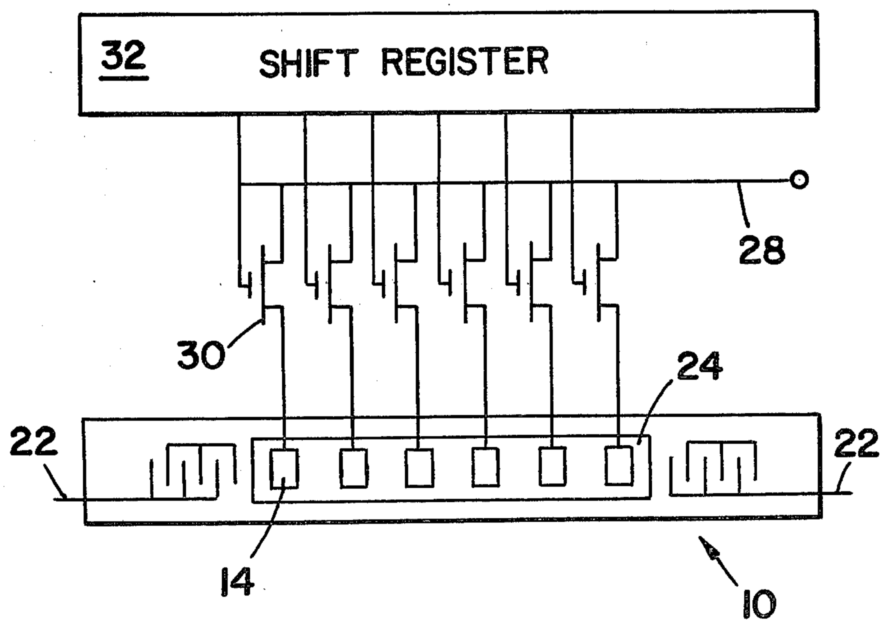
FIG. 2 is a diagrammatic view of the SAW storage correlator. implemented in a specific embodiment to provide the SAW/FET signal processor of the present invention.

Referring to FIG. 2, a diagrammatic view of the present invention is shown in which high frequency signal processing controlled by low frequency analog or digital signals is provided. In this embodiment, each diode 14 in the array is connected to a common external terminal 28 by a series of FET switches 30. The FET switches 30 are in turn connected to a low-speed, low-frequency device such as a shift-register 32. A shift register is shown only by way of example and not limitation since other low-frequency devices such as charge-coupled devices, random access memories and the like can also be connected to the FET switches 30 to provide low-frequency control of the high-frequency SAW device.

In operation as shown in FIG. 2, the FET switches 30 are sequentially controlled by signals from the tapped shift register 32. Thus a controllable amount of charge can be serially injected into each diode 14 or the charge on the diodes can be sampled via the multiplexed FET switches 30. Additionally, the charge on the diodes 14 may be controlled via the low-frequency addressable FET switches 30 in order to determine the characteristics of a high-frequency wave output from the device. There are therefore several modes of operation unique to the SAW/FET constructed as taught that are not available to prior art.

In a first mode of operation, a charge pattern is stored in the diode array 14 by the technique of using the FET switches 30 or by the technique of using one of the interdigital transducers 22 in concert with the top plate 24 as described above. A high-frequency waveform input to one of the interdigital transducers 22 may then be read out at the top plate 24 as the correlation product of the two signals. Conversely, a high-frequency waveform input to the top plate may also be read out at one of the interdigital transducers as the correlation product of the two signals. In either mode, the device acts as a monolithic filter which can be programmed by a low frequency signal processing system yet which can process very high speed analog signals.

In an alternative mode of operation, a high-frequency surface acoustic wave or bulk acoustic wave may be input to the device causing the ZnO layer 20 to modulate the charge stored in the diode array 14. Prior art devices do not provide such modulation by input of bulk acoustic waves. The modulated charge pattern in the array 14 may then be slowly read out via the low-frequency addressable FET switches 30 into a low-speed digital processing system such as a shift register 32, for example. Thus the present device provides the capability to capture fast signals for subsequent input to low-speed processing systems.

The device may also be used as a conventional storage correlator in which the correlation between two high frequency signals is stored in the diode array. However, unlike conventional correlators, the present invention permits the stored correlation signal to be slowly read out into a low speed digital processing system via the top plate 24 or one of the transducers 22. Thus the present invention provides a unique interface between very high frequency acoustic signal processing systems (50 MHz–1 GHz) and relatively low frequency, low-speed data processing systems (2–10 MHz).

What is claimed is:

1. A monolithic, programmable apparatus for performing high-frequency, high-speed signal processing under the control of low-frequency, low-speed electrical signals comprising:

(a) a semiconductor substrate having in its central region an integrated circuit array of charge carriers;

(b) an insulating oxide layer, said layer grown over said array of said charge carriers and extending over the entire upper surface of said substrate;

(c) a pair of conducting pads deposited upon said oxide layer, said pads located at oposite ends of said substrate;

(d) a film of a piezoelectric material deposited over said conducting pads and the entire surface of said oxide layer;

(e) means for inserting an electroacoustic signal into said substrate, said inserting means also having capability for retrieving said signal;

(f) means for addressing each of said charge carriers selectively such that the charge in each of said carriers may be sampled and regulated, said addressing means permitting storage of said electroacoustic signal and any selective modulation of said signal;

(g) means for inputting an analog signal to said addressing means; and (h) means for controlling said addressing means with said low-speed, low-frequency electrical signals.

2. An apparatus as recited in claim 1 wherein said integrated circuit array of said charge carriers in said semiconductor substrate is a linear array of at least 2 diodes per acoustic wavelength.

3. An apparatus as recited in claim 1 wherein said film of piezoelectric material is zinc oxide.

4. An apparatus as recited in claim 1 wherein said addressing means is a plurality of FET switches fabricated in said substrate equal in number to the number of said charge carriers in said substrate, each of said FET switches having a source, a drain and a gate for electrical connection to other electrical components, all integrated in the same said substrate, said FET switches being connected such that each of said sources is connected to an associated said charge carrier while all of said drains are connected to a common electrical signal input line and all of said gates are connected operably to said controlling means.

5. An apparatus as recited in claim 1 wherein said controlling means is a shift register.

6. An apparatus as recited in claim 1 wherein said controlling means is a bucket brigade circuit.

7. An apparatus as recited in claim 1 wherein said controlling means is a random access memory.

8. An apparatus as recited in claim 1 wherein said controlling means is a digital signal processing system.

* * * * *